United States Patent

Knowles et al.

(10) Patent No.: US 10,541,688 B2
(45) Date of Patent: Jan. 21, 2020

(54) RING OSCILLATOR CIRCUIT WITH FREQUENCY STABILIZATION

(71) Applicant: BAE SYSTEMS INFORMATION AND ELECTRONIC SYSTEMS INTEGRATION INC., Nashua, NH (US)

(72) Inventors: Kenneth R. Knowles, Manassas, VA (US); Daniel Pirkl, Centreville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 49 days.

(21) Appl. No.: 15/832,502

(22) Filed: Dec. 5, 2017

(65) Prior Publication Data

US 2019/0173474 A1 Jun. 6, 2019

(51) Int. Cl.
*H03K 3/03* (2006.01)
*H03L 1/02* (2006.01)
*H03L 7/00* (2006.01)

(52) U.S. Cl.
CPC ............. *H03L 7/00* (2013.01); *H03K 3/0315* (2013.01); *H03L 1/022* (2013.01)

(58) Field of Classification Search
CPC ...... H03K 3/0315; H03K 3/0322; H03L 1/02; H03L 1/022; H03L 7/0995
USPC .......................................................... 331/57
See application file for complete search history.

(56) References Cited

U.S. PATENT DOCUMENTS

| | | | | |
|---|---|---|---|---|
| 5,061,907 A | * | 10/1991 | Rasmussen | G05F 3/247 331/108 B |
| 5,180,995 A | * | 1/1993 | Hayashi | H03B 5/04 331/176 |
| 5,499,214 A | * | 3/1996 | Mori | G11C 11/406 331/57 |
| 5,905,412 A | * | 5/1999 | Rasmussen | H03K 3/011 327/288 |
| 6,304,148 B1 | * | 10/2001 | Nomura | G11C 7/04 326/95 |
| 6,448,862 B1 | | 9/2002 | Yoder et al. | |
| 6,856,566 B2 | * | 2/2005 | Takahashi | G11C 7/04 365/175 |
| 8,547,178 B2 | | 10/2013 | Wood et al. | |
| 2005/0030109 A1 | * | 2/2005 | Kim | H03K 3/011 331/16 |
| 2014/0327486 A1 | * | 11/2014 | Roine | H03B 5/24 331/108 C |
| 2015/0116042 A1 | * | 4/2015 | Kim | H03K 3/011 331/57 |

* cited by examiner

*Primary Examiner* — Levi Gannon
(74) *Attorney, Agent, or Firm* — Antony P. Ng; Russell Ng PLLC; Scott J. Asmus

(57) ABSTRACT

A ring oscillator circuit is disclosed. The ring oscillator in one embodiment includes an odd number of inverters connected in a loop fashion, a current mirror having a drain of a first transistor connected to the inverters, and a self-biased inverter connected to a drain of a second transistor of the current mirror.

15 Claims, 3 Drawing Sheets

US 10,541,688 B2

RING OSCILLATOR CIRCUIT WITH FREQUENCY STABILIZATION

STATEMENT OF GOVERNMENT INTEREST

The present disclosure was made with government support under Contract No. 13-C-0007 awarded by a classified customer. The United States Government has certain rights in the inventions.

TECHNICAL FIELD

The present disclosure relates to electronic circuits in general, and in particular to ring oscillator circuits. Still more particularly, the present disclosure relates to a ring oscillator circuit with frequency stabilization.

BACKGROUND

Ring oscillators are commonly utilized to generate clock signals in digital circuits. A ring oscillator typically includes an odd number of digital inverters connected in a loop fashion. The oscillation frequency, or oscillation period, of a ring oscillator is determined by the delay though the inverter stages within the ring oscillator.

With older complementary-metal oxide semiconductor (CMOS) technologies (such as 90 nm channel length and longer), inverter delays within ring oscillators tend to increase with temperature, which in turn decrease the oscillation frequency of ring oscillators. As a remedy, various circuit techniques had been developed to counteract this effect. However, with newer CMOS technologies (such as 45 nm channel length and shorter), the oscillation frequencies of ring oscillators tend to increase with temperature, so new circuit techniques for frequency compensation are needed for ring oscillators manufactured in newer CMOS technologies.

The present disclosure is related to an improved CMOS ring oscillator.

SUMMARY

In accordance with one embodiment of the present system, a ring oscillator includes an odd number of inverters connected in a loop fashion, a current mirror having a drain of a first transistor connected to the inverters, and a self-biased inverter connected to a drain of a second transistor of the current mirror.

The features and advantages described herein are not all-inclusive and, in particular, many additional features and advantages will be apparent to one of ordinary skill in the art in view of the drawings, specification and claims. Moreover, it should be noted that the language used in the specification has been selected principally for readability and instructional purposes and not to limit the scope of the inventive subject matter.

BRIEF DESCRIPTION OF THE DRAWINGS

The invention itself, as well as its modes of use, further objects, and advantages thereof, will best be understood by reference to the following detailed description of an illustrative embodiment when read in conjunction with the accompanying drawings.

DETAILED DESCRIPTION

Figure 1:
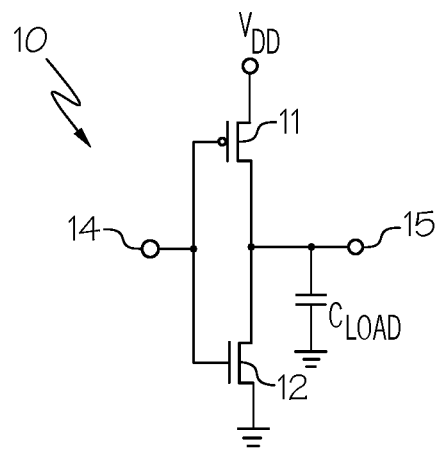
FIG. 1 is a schematic diagram of an inverter according to the prior art.

Referring now to the drawings and in particular to FIG. 1, there is illustrated a schematic diagram of a typical inverter according to the prior art. As shown, an inverter 10 includes a P-channel field-effect transistor (PFET) 11 and an N-channel field-effect transistor (NFET) 12 connected in series between a power supply VDD and ground. An input signal at an input 14 can drive the gates of PFET 11 and NFET 12 in parallel. An output 15 is loaded by a capacitance $C_{LOAD}$ that includes an input capacitance of the logic gates it drives along with the parasitic self-capacitances of PFET 11 and NFET 12.

PFET 11 turns on when the input voltage at input 14 is low enough that its gate terminal voltage is more negative than its source terminal by at least the threshold voltage ($V_{Tp}$) of PFET 11. NFET 12 turns on when the input voltage at input 14 is high enough that its gate terminal voltage is more positive than its source terminal by at least the threshold voltage ($V_{Tn}$) of NFET 12.

Figure 2A:
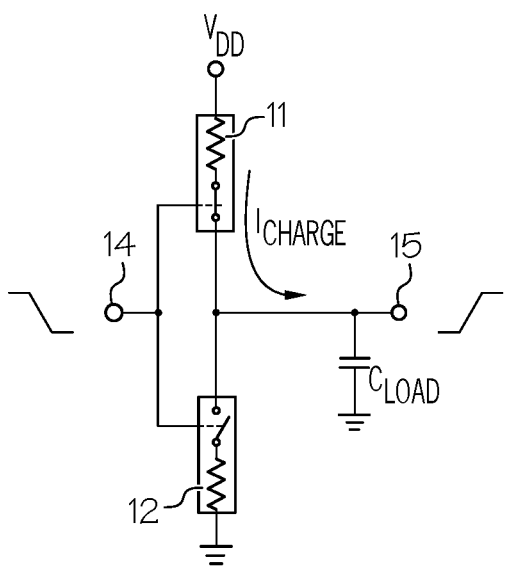
FIG. 2A shows an input of the inverter from FIG. 1 switches from a logic High to a logic Low.
Figure 2B:
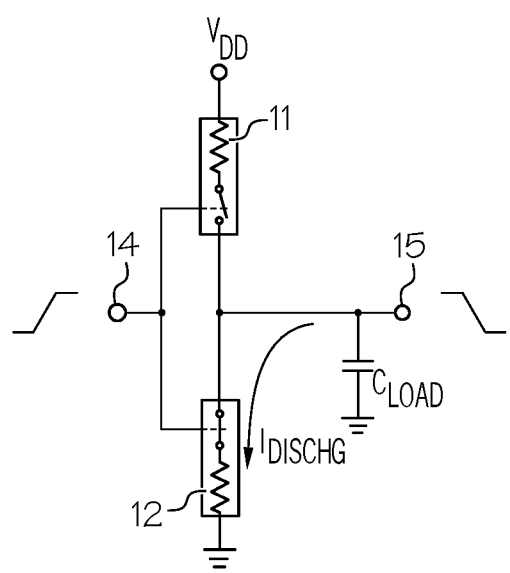
FIG. 2B shows an input of the inverter from FIG. 1 switches from a logic Low to a logic High.

When the input signal at input 14 switches from a logic High level to a logic Low level, as depicted in FIG. 2A, PFET 11 turns on while NFET 12 remains off. PFET 11 charges the output load capacitance up towards $V_{DD}$ through its ON resistance, causing the load voltage at output 15 to go to a logic High level. When the input signal at input 14 switches from a logic Low level to a logic High level, as depicted in FIG. 2B, NFET 12 turns on while PFET 11 remains off. NFET 12 discharges the output load capacitance towards ground through its ON resistance, causing the output voltage at output 15 to go to a logic Low level. The ON resistances of FETs 11, 12 limit the rates of charging and discharging of load capacitance. The resulting finite rise and fall times delay the output signal state change responding to an input signal state change.

The rise and fall times of inverters generally depend on temperature, manufacturing process variations, and power supply voltage. This may lead to variations in ring oscillator frequencies. Some applications can tolerate such variations, which can typically span a 2:1 range as process, power supply voltage, and temperature change. However, digital circuits often require more precise control of clock frequency in order to meet a myriad of rigorous timing margins. When a circuit designer cannot control the process and temperature variations, the circuit designer can often use the power supply voltage sensitivity to compensate for the process and temperature variations. For example, phase-locked loop circuits often use this method to synchronize ring oscillators to an external crystal or other stable oscillator.

It is well known that in CMOS transistors, carrier mobility and threshold voltage decrease as temperature increases. Decreased carrier mobility reduces drive current, which slows down an inverter. However, decreased threshold voltage increases drive current, which speeds up an inverter. The mobility decrease with temperature was the dominant effect in previous technology generations (such as 90 nm channel length and longer). In newer CMOS transistors (such as 45 nm channel length and shorter), the threshold voltage decrease with temperature tends to dominate over the mobility decrease. As temperature increases, the resulting increased drive strength causes CMOS inverters to run faster, and draws more current from a power supply.

Figure 3:
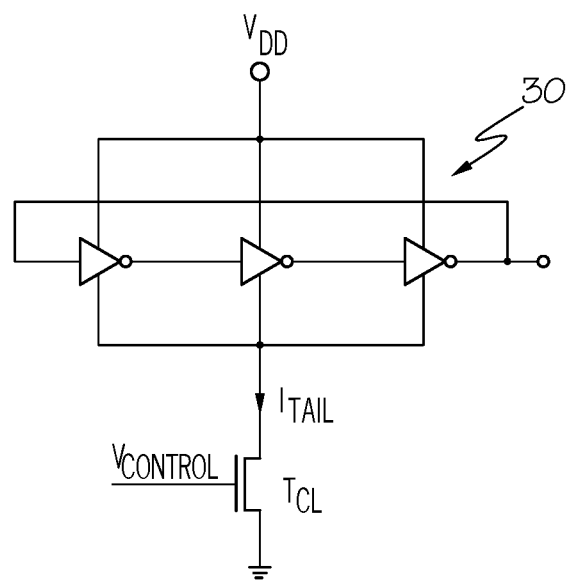
FIG. 3 is a schematic diagram of a ring oscillator circuit having a current limiting transistor.

In a current-controlled (current starved) ring oscillator, the power supply voltage applied to the inverters can be varied by regulating the current through either or both of the power and ground terminals. FIG. 3 shows a ring oscillator 30 connected to ground via a current limiting transistor $T_{CL}$. Transistor $T_{CL}$ limits current $I_{TAIL}$ from ring oscillator 30. To effect this, a portion of the external power supply voltage is dropped between the drain and source of transistor $T_{CL}$, which in turn limits the remaining supply voltage applied across each inverter stage within ring oscillator 30. The reduction of $I_{TAIL}$ increases inverter propagation delay within ring oscillator 30, and lengthens the oscillation period of ring oscillator 30, i.e., reducing the oscillation frequency of ring oscillator 30.

Figure 4:
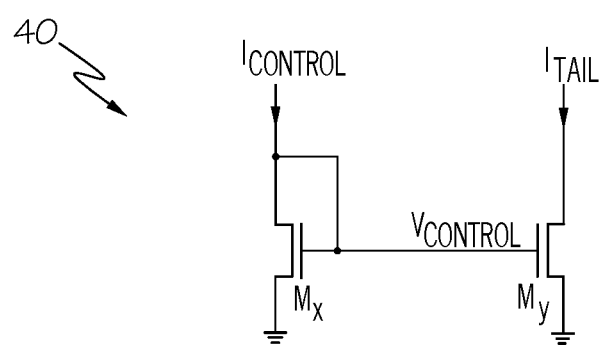
FIG. 4 is a schematic diagram of a current mirror circuit.

The control voltage that sets $I_{TAIL}$ can be provided by a current mirror circuit. With reference now to FIG. 4, there is illustrated a schematic diagram of a current mirror, according to one embodiment. As shown, a current mirror circuit 40 includes transistor $M_x$ and transistor $M_y$. The relative sizes of transistor $M_x$ and transistor $M_y$ are selected to regulate $I_{TAIL}$ to be approximately equal to an input signal $I_{CONTROL}$. In addition, transistor $M_x$ is diode-connected (i.e., its gate being connected to its drain). An increase in current $I_{CONTROL}$ causes transistor $M_x$'s drain voltage to rise, and transistor $M_x$'s gate voltage also rises by the same amount, which causes transistor $M_x$'s drain current to increase, and tries to pull the drain voltage of transistor $M_x$ back down. This negative feedback effect causes the drain voltage and gate voltage of transistor $M_x$ to stabilize at a value where transistor $M_x$'s drain current is equal to input current $I_{CONTROL}$. Thus, transistor $M_x$'s gate voltage is determined by the magnitude of $I_{MIRROR}$ and the characteristics of transistor $M_x$.

Since transistor $M_y$ has the same gate voltage as transistor $M_x$, transistor $M_y$ attempts to draw the same amount of current through its drain. Thus, $I_{TAIL}$ becomes approximately equal to $I_{CONTROL}$. If transistor $M_y$'s drain is connected to a ring oscillator, such as ring oscillator 30 in FIG. 3, increasing current $I_{CONTROL}$ will also increase current $I_{TAIL}$, which causes the oscillation frequency of the ring oscillator to increase. Current $I_{CONTROL}$ is then adjusted to produce the desired oscillation frequency for ring oscillator 30. However, due to the temperature effects described above, the oscillation frequency in a sub-45 nm CMOS ring oscillator increases with temperature despite holding current $I_{CONTROL}$ at a fixed value.

A single inverter whose output is connected to its input does not have sufficient phase shift to oscillate, but instead will self-bias all of its internal transistors to be turned on simultaneously. In 45 nm and shorter channel length CMOS technology, a self-biased inverter draws more power supply current as temperature increases, as mentioned above. This behavior can be exploited to help regulating the temperature sensitivity of a sub-45 nm CMOS ring oscillator.

Figure 5:
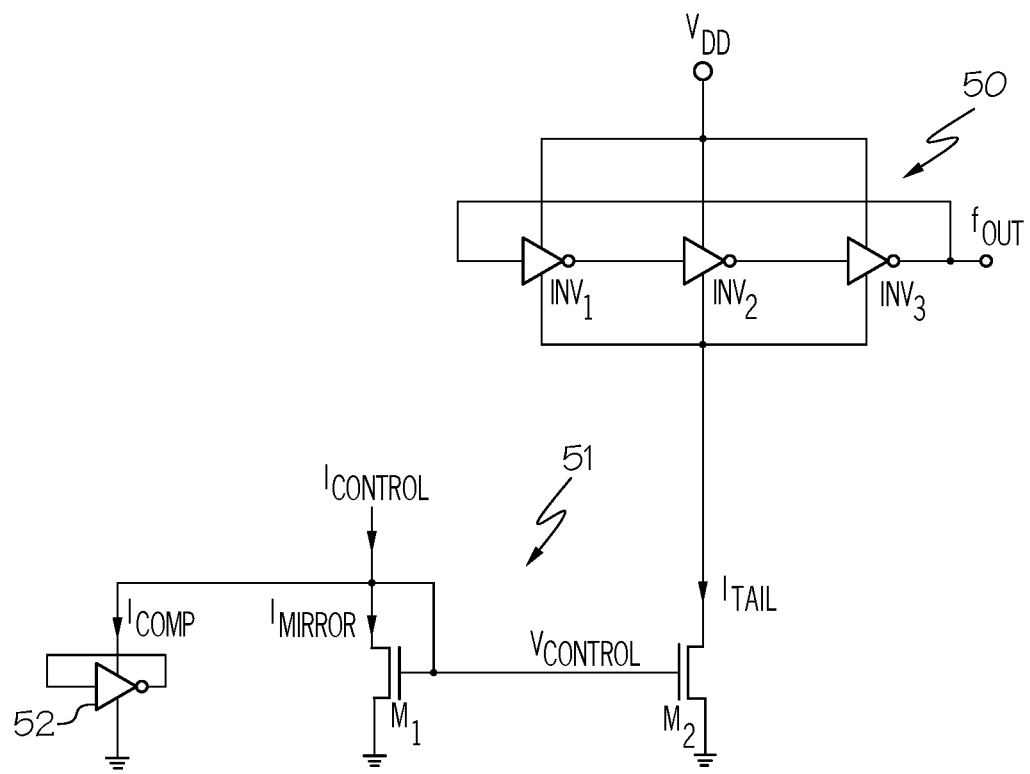
FIG. 5 is a schematic diagram of a ring oscillator circuit with frequency stabilization, in accordance with one embodiment.

Referring now to FIG. 5, there is depicted a schematic diagram of a ring oscillator circuit with frequency stabilization, according to one embodiment. As shown, a ring oscillator 50 includes inverters $INV_1$-$INV_3$, a current mirror circuit 51 and a self-biased inverter 52. Inverters $INV_1$, $INV_2$, and $INV_3$ are connected in a loop fashion. Specifically, the output of $INV_1$ is connected to the input of $INV_2$, the output of $INV_2$ is connected to the input of $INV_3$, and the output of $INV_3$ is connected to the input of $INV_1$. Ring oscillator 50 provides frequency output at $f_{OUT}$.

Current mirror circuit 51 includes an NFET $M_1$ and an NFET $M_2$. Specifically, the drain of NFET $M_1$ is connected to $I_{CONTROL}$, and the source of NFET $M_1$ is connected to ground. The drain of NFET $M_2$ is connected to the sources of the NFETs within inverters $INV_1$, $INV_2$, and $INV_3$, and the source of NFET $M_2$ is connected to ground. The gate of NFET $M_1$ is connected to the drain of NFET $M_1$ and the gate of NFET $M_2$.

The drain of self-biased inverter 52 is connected to the drain of NFET $M_1$, and the source of self-biased inverter 52 is connected to ground. The output of self-biased inverter 52 is connected to the input of self-biased inverter 52. Self-biased inverter 52 diverts a portion of current $I_{CONTROL}$, i.e., current $I_{COMP}$, away from the drain of NFET $M_1$, and the remaining of current $I_{CONTROL}$, i.e., $I_{MIRROR}$, sets NFET $M_1$ and the gate bias of NFET $M_2$. Since current $I_{COMP}$ increases as temperature increases, current $I_{MIRROR}$ and current $I_{TAIL}$ are reduced as temperature increases. The reduction of current $I_{TAIL}$ helps to counteract the tendency for the oscillation frequency of ring oscillator 51 to increase at high temperatures.

Since self-biased inverter 52 uses the same type of transistors as inverters $INV_1$, $INV_2$, and $INV_3$ (i.e., manufactured under the same CMOS technology), its current is proportional to temperature in the same way as that of inverters $INV_1$, $INV_2$, and $INV_3$. Self-biased inverter 52 may include several inverters in parallel, or it may have the dimensions of its internal transistors scaled to change the magnitude of current $I_{COMP}$ relative to that of current $I_{TAIL}$. Thus, the magnitude of current $I_{COMP}$ can be set for an optimum compensation of current $I_{TAIL}$ versus temperature.

As has been described, the present disclosure provides a ring oscillator circuit with frequency stabilization.

While the invention has been particularly shown and described with reference to a preferred embodiment, it will be understood by those skilled in the art that various changes in form and detail may be made therein without departing from the spirit and scope of the invention.

What is claimed is:

1. A ring oscillator comprising:
   a plurality of inverters connected in a loop fashion;
   a current mirror having a drain of a first transistor connected to said plurality of inverters; and
   a self-biased inverter connected to a drain of a second transistor of said current mirror;
   wherein an output of said self-biased inverter is connected to an input of said self-biased inverter; and
   wherein a supply current of said self-biased inverter is subtracted from said drain of said first transistor of said current mirror to regulate a frequency of said ring oscillator.

2. The ring oscillator of claim 1, wherein said drain of said first transistor of said current mirror is connected to sources of transistors within said plurality of inverters.

3. The ring oscillator of claim 1, wherein sizes of said first and second transistors of said current mirror are selected to regulate a drain current of said first transistor to be approximately equal to a drain current of said second transistor.

4. The ring oscillator of claim 1, wherein said second transistor of said current mirror is diode-connected.

5. The ring oscillator of claim 1, wherein a drain of a transistor within said self-biased inverter is connected to said drain of said second transistor of said current mirror.

6. The ring oscillator of claim 5, wherein a source of said transistor within said self-biased inverter is connected to Ground.

7. The ring oscillator of claim 1, wherein dimensions of transistors within said self-biased inverter are scaled to change the magnitude of current to said transistors within said self-biased inverter relative to current of said first transistor of said current mirror.

8. The ring oscillator of claim 1, wherein said self-biased inverter includes a plurality of inverters connected in parallel.

9. The ring oscillator of claim 1, wherein said first and second transistors have a channel length of less than 45 nm.

10. The ring oscillator of claim 1, wherein a source of said first transistor of said current mirror is connected to Ground.

11. The ring oscillator of claim 10, wherein a source of said second transistor of said current mirror is connected to Ground.

12. A temperature compensating system for a ring oscillator, comprising:
 a plurality of inverters connected in a loop fashion and forming the ring oscillator;
 a current mirror having a first transistor and a second transistor, wherein a drain of the first transistor is connected to the plurality of inverters for controlling the ring oscillator; and
 a self-biased inverter connected to a drain of the second transistor of the current mirror, wherein the self-biased inverter draws a compensation current as a circuit temperature increases, and wherein the compensation current of the self-biased inverter is subtracted from the drain of the first transistor of the current mirror to regulate a frequency of the ring oscillator as the circuit temperature increases;
 wherein an output of the self-biased inverter is connected to an input of said self-biased inverter.

13. The temperature compensating system according to claim 12, wherein an inverter type of the self-biased inverter is the same type as the plurality of inverters.

14. The temperature compensating system according to claim 12, wherein the self-biased inverter comprises several inverters in parallel.

15. The temperature compensating system according to claim 12, wherein transistor dimensions of the self-biased inverter are scaled to adjust a magnitude of the compensation current subtracted from the drain of the first transistor of the current mirror.

* * * * *